United States Patent [19]
Masuda

[11] Patent Number: 5,594,281
[45] Date of Patent: Jan. 14, 1997

[54] SEMICONDUCTOR APPARATUS HAVING WIRING STRUCTURE OF AN INTEGRATED CIRCUIT IN WHICH A PLURALITY OF LOGIC CIRCUITS OF THE SAME STRUCTURE ARE ARRANGED IN THE SAME DIRECTION

[75] Inventor: Masami Masuda, Yokohama, Japan

[73] Assignee: Kabushiki Kaisha Toshiba, Tokyo, Japan

[21] Appl. No.: 608,937

[22] Filed: Feb. 29, 1996

Related U.S. Application Data

[63] Continuation of Ser. No. 291,775, Aug. 17, 1994, abandoned.

[30] Foreign Application Priority Data

Sep. 6, 1993 [JP] Japan .................................... 5-245946

[51] Int. Cl.$^6$ ............................. H01L 23/48; H01L 29/44
[52] U.S. Cl. .......................... 257/773; 257/774; 257/920; 257/923
[58] Field of Search .................................. 257/774, 776, 257/781, 602, 268, 269, 451, 480, 773, 786, 920, 784, 923; 307/602

[56] References Cited

U.S. PATENT DOCUMENTS

| | | | |
|---|---|---|---|
| 4,782,253 | 11/1988 | Shoji | 307/602 |
| 5,294,837 | 3/1994 | Takase et al. | 257/774 |

FOREIGN PATENT DOCUMENTS

| | | | |
|---|---|---|---|
| 61-296761 | 12/1986 | Japan | 257/666 |
| 4269860 | 9/1992 | Japan | 257/666 |
| 4255246 | 9/1992 | Japan | 257/666 |
| 5121548 | 5/1993 | Japan | 257/666 |

OTHER PUBLICATIONS

European Serarch Report, dated Jan. 11, 1995, appl. No. 94113133.6

*Primary Examiner*—Donald L. Monin, Jr.
*Attorney, Agent, or Firm*—Loeb & Loeb LLP

[57] ABSTRACT

In a semiconductor apparatus, a first circuit provided on a major surface of a semiconductor substrate. The first circuit includes a plurality of logic circuits of an identical structure, the logic circuits having input terminals supplied with identical signals. First metal wiring is provided on the semiconductor substrate in a direction identical to a direction of arrangement of the logic circuits, the first metal wiring being connected to one of the input terminals of each of the logic circuits. A second circuit provided on the major surface of the semiconductor substrate in an outside area which does not overlap an area extending in a direction perpendicular to the direction of arrangement of the logic circuits, the second circuit supplying an identical signal to the input terminals of the logic circuits of the first circuit. A second metal wiring is connected between an output terminal of the second circuit and a substantially middle point of the first metal wiring. The second metal wiring has a portion situated in parallel to the logic circuits. Thereby, an influence of wiring delay due to a difference in distances among the logic circuits can be reduced and a high-speed operation is achieved.

21 Claims, 4 Drawing Sheets

SEMICONDUCTOR APPARATUS HAVING WIRING STRUCTURE OF AN INTEGRATED CIRCUIT IN WHICH A PLURALITY OF LOGIC CIRCUITS OF THE SAME STRUCTURE ARE ARRANGED IN THE SAME DIRECTION

This is a continuation of application Ser. No. 291,775 filed Aug. 17, 1994 now abandoned.

BACKGROUND OF THE INVENTION

1. Field of the Invention

The present invention relates to a semiconductor apparatus capable of reducing to a minimum a wiring delay of an input signal in an integrated circuit in which a plurality of logic circuits are arranged in the same direction, thereby achieving high-speed operations.

2. Description of the Related Art

In semiconductor apparatus such as IC and LSI, a plurality of logic circuits of the same structure are, in most cases, arranged on a substrate in the same direction.

A general semiconductor memory apparatus such as an SRAM comprises two parts: a part wherein a plurality of logic circuits of the same structure, e.g. memory cell arrays, row decoders/column decoders, section decoders and section amplifiers, are arranged in the same direction on the most area of a semiconductor substrate (i.e. chip), and a part surrounding the chip, wherein address buffers, control signal buffers and data input/output (I/O) buffers are arranged.

Normally, signals are transmitted among the logic circuits via a single metal wiring layer or multiple metal wiring layers formed on the chip.

The metal wiring layers are arranged so that the wiring area may reduce to a minimum in consideration of the influence on the chip size. In addition, the metal wiring layers are arranged to have a minimum length in consideration of the influence of parasitic capacitance C and/or parasitic resistance R upon signals.

FIG. 1 shows an example of a circuit constituting a semiconductor memory. Specifically, FIG. 1 shows arrangement of metal wiring for connecting an address buffer 6, a row decoder 3 and a decoder control circuit 9. The number of address buffers 6 is equal to the number (N) of addresses, and each address buffer 6 outputs a signal A/$\overline{A}$ ($\overline{A}$ is a complimentary signal of signal A). The decoder control circuit 9 outputs a control signal EN for the decoder. In the row decoder 3, a $2^N$-number of logic circuits (51, 52, . . . , 5m) having (N+1) inputs are arranged in the same direction, and input terminals of each logic circuit are supplied with an address signal A/$\overline{A}$ and a control signal EN.

In these metal wirings, parasitic capacitance C and parasitic resistance R are present as distributed constants, and a delay of input signals occurs. Such a delay of input signals further increases since an input capacitance at each input terminal functions as a load.

The degree of propagation delay of the output A/$\overline{A}$ increases as it reaches, or input to, a point farther from the address buffer 6, i.e., in the order from a point a at an output terminal of a driver provided within the buffer 6, a point b at an input terminal of the logic circuit 51 closest to the address buffer 6, and a point c at an input terminal of the logic circuit 5m remotest from the address buffer 6.

FIGS. 2 and 3 are characteristic graphs illustrating delay states of the input signals at the points a, b and wherein c.

The number of arranged logic circuits constituting the row decoder 3 increases in accordance with an increase in memory capacity, and the propagation delay from the point b to point c increases accordingly.

In a signal line for transmitting a control signal EN from the decoder control circuit 9, similar propagation delay occurs with respect to the control signal EN input to a point d at an output terminal of a driver provided in the decoder control circuit 9, a point e at an input terminal of the logic circuit 5m closest to the decoder control circuit 9 and a point f at an input terminal of the logic circuit 51 farthest from the decoder control circuit 9. The propagation delay has considerable influence upon the circuit operation.

Such influence of propagation delay upon the circuit operation will now be described with reference to FIG. 4.

Suppose that the decoder control signal EN is changed from a high (H) level to a low (L) level at point d by the driver of the decoder control circuit 9. At this time, owing to the aforementioned wiring delay, the control signal EN is changed from H level to L level with a delay at point f.

There are two cases where the output A/$\overline{A}$ of the address buffer 6 changes from L level to H level and it changes from H level to L level. When the output A/$\overline{A}$ has changed from L to H, it is possible that the level of the output A/$\overline{A}$ may temporarily change from L to H to L at the logic circuit 5 of the row decoder 3 and the decoder 3 may be activated. In order to avoid this, the output A/$\overline{A}$ of the address buffer 6 is changed after the control signal EN has been completely changed from H to L at point f.

In the case where the output A/$\overline{A}$ of the address buffer 6 has changed from H to L, too, the output level changes from H to L with a delay at point c at the input terminal of the logic circuit 5m owing to the wiring delay.

The decoder control signal EN is changed from L to H after the output A/$\overline{A}$ has been completely changed from H to L at point c. This is intended to prevent the decoder 3 from being temporarily activated when the output level is changed from L to H to L at the logic circuit 5m of the row decoder 3.

As has been described above, the row decoder 3 is activated when the decoder control signal EN is changed from L level to H level. At this time, of course, the change of level of the decoder control signal from L to H is delayed by the wiring delay at point f, and the logic circuit 51 of the row decoder 3, which has the input terminal at point f, is activated lastly.

As has been described above, the time needed until the row decoder 3 is activated is determined by the wiring delay. The greater the wiring delay, the longer the time needed for the activation of the row decoder 3. In particular, as is shown in FIG. 1, if the address buffer 6 for generating the input signal is arranged in an outside area which does not overlap an area extending in a direction perpendicular to the direction of arrangement of the logic circuits of the row decoder 3, the difference in distance between the input terminal of the logic circuit situated close to the address buffer 6 and the input terminal of the logic circuit situated away from the address buffer 6 results in a difference in wiring delay. The greater the wiring distance, the more the high-speed operation of the semiconductor apparatus becomes difficult.

SUMMARY OF THE INVENTION

The present invention has been made in order to solve the above problem and the object of the present invention is to provide a semiconductor apparatus having an improved wiring structure of an integrated circuit in which a plurality of logic circuits of an identical structure are arranged in the same direction, whereby wiring delay of metal wiring of input signal lines is reduced to a minimum and a high-speed operation is achieved.

In order to achieve the above object, there is provided a semiconductor apparatus comprising:

a semiconductor substrate;

a first circuit provided on a major surface of the semiconductor substrate and including a plurality of logic circuits of an identical structure, the logic circuits having input terminals supplied with identical signals;

first metal wiring provided on the semiconductor substrate in a direction identical to a direction of arrangement of the logic circuits, the first metal wiring being connected to one of the input terminals of each of the logic circuits;

a second circuit provided on the major surface of the semiconductor substrate in an outside area which does not overlap an area extending in a direction perpendicular to the direction of arrangement of the logic circuits, the second circuit supplying an identical signal to the input terminals of the logic circuits of the first circuit; and second metal wiring connected between an output terminal of the second circuit and the first metal wiring and having a portion situated in parallel to the logic circuits.

According to the above structure, the present invention can provide a semiconductor apparatus wherein an influence of wiring delay due to a difference in distances among the logic circuits provided on the major surface of the semiconductor substrate can be reduced and a high-speed operation is achieved.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

An embodiment of the present invention will now be described with reference to the accompanying drawings.

Figure 5:
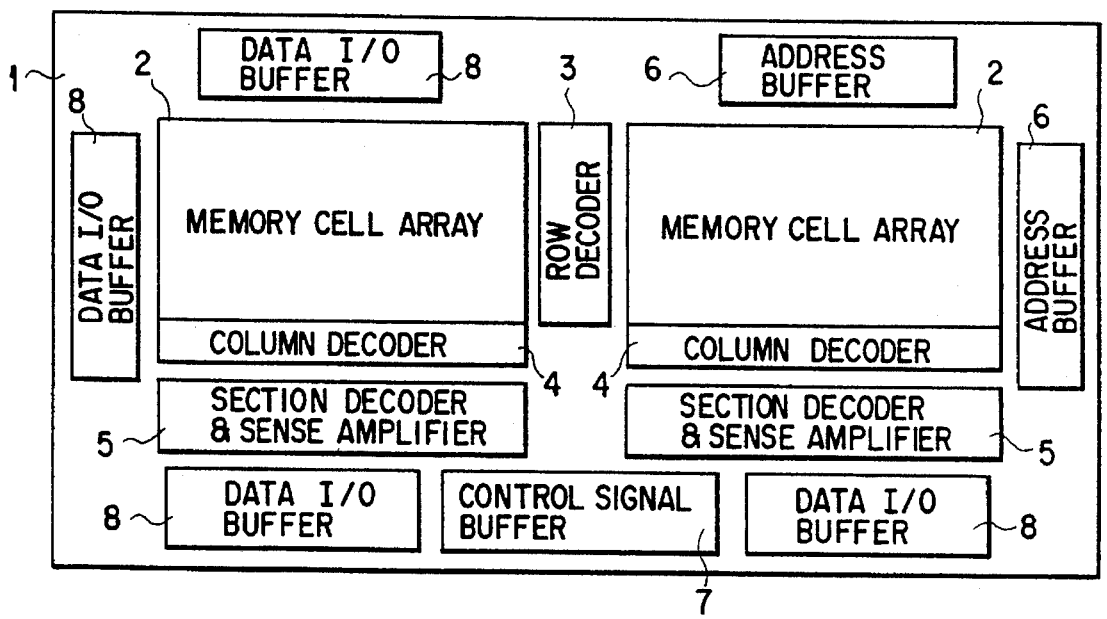
FIG. 5 shows a layout of circuit elements of the semiconductor apparatus of the present invention on a semiconductor substrate.

FIG. 5 shows a layout of circuit elements of a semiconductor apparatus according to the present invention on a semiconductor substrate 1. In this layout, there are provided a portion wherein a plurality of circuits of the same structure, each including a memory cell array 2, a row decoder 3, a column decoder 4, a section decoder/sense amplifier 5, are repeatedly provided on a major area, and a portion provided around chips wherein address buffers 6, control signal buffers 7, data output buffers 8 are arranged.

Normally, transmission signals between circuits is effected by single-layer or multi-layer metal wiring.

Figure 6:
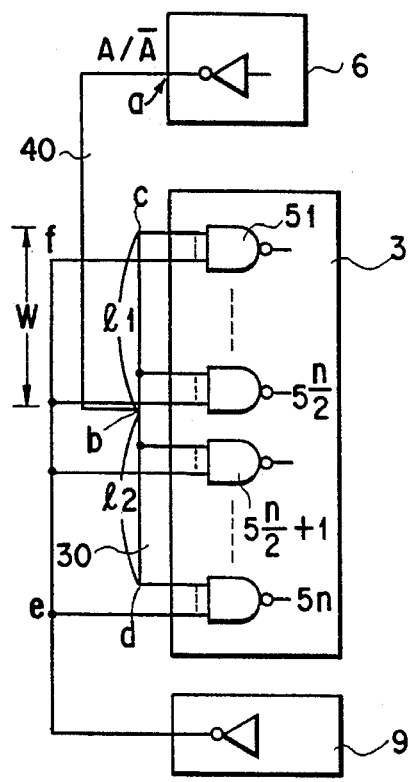
FIG. 6 shows a structure of a main circuit portion of a semiconductor apparatus according to a first embodiment of the present invention.

FIG. 6 is a circuit diagram of a semiconductor memory, showing an arrangement of metal wiring for connecting the address buffer 6, row decoder 3 and decoder control circuit 9. The number of address buffers 6 is equal to the number (N) of addresses. Each address buffer 6 outputs a signal A/$\overline{A}$ ($\overline{A}$ is a complementary signal of A). The decoder control circuit 9 outputs a decoder control signal EN. In the row decoder 3, an $2^N$-number of logic circuits ($51, 52, \ldots, 5n$) are arranged in the same direction.

Figure 7:
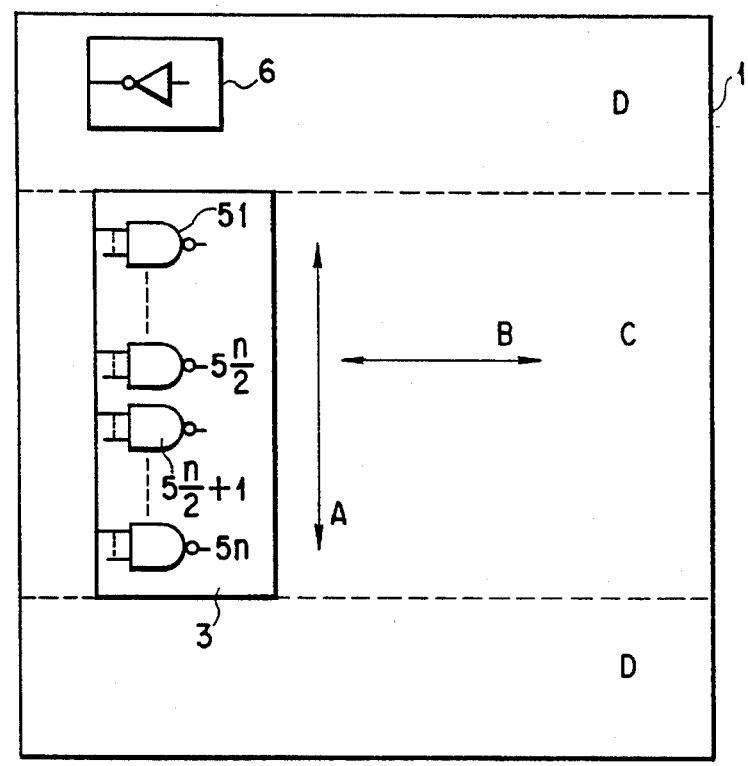
FIG. 7 shows a layout of circuit elements shown in FIG. 6 on a semiconductor substrate.

The address buffer 6 and row decoder 3 are arranged on the semiconductor substrate 1, as shown in FIG. 7. The address buffer 6 is situated in an outside area D which does not overlap an area C extending in a direction B perpendicular to a direction A of arrangement of the row decoder 3.

First wiring 30 is connected to input terminals of the logic circuits $51, \ldots, 5n$ and is provided in parallel to the direction of arrangement of the logic circuits $51, \ldots, 5n$. The first wiring 30 includes a point c connected to the input terminal of the logic circuit 51 closest to the address buffer 6, a point d connected to the input terminal of the logic circuit $5n$ farthest from the address buffer 6, and a point b which is a substantially middle point of the first wiring 30.

Second wiring 40 is connected between a point a at the output terminal of the address buffer 6 and the substantially middle point b of the first wiring 30. The second wiring 40 includes a portion W extending in parallel to the first wiring 30.

The second wiring 40 is connected at one end to the substantially middle point b of the first wiring 30 since this manner of connection is advantageous in reducing the difference in distance between the output terminal of the address buffer 6 and each logic circuit.

The number of logic circuits is normally an even number. The substantially middle point b of the first wiring 30 lies between the n/2-th logic circuit and (n/2)+1-th logic circuit.

A signal line for connecting the decoder control circuit 9 and the logic circuits 51, . . . , 5n of the row decoder 3 includes a point e connected to the input terminal of the logic circuit 5n closest to the decoder control circuit 9 and a point f connected to the input terminal of the logic circuit 51 farthest from the decoder control circuit 9.

Figure 1:
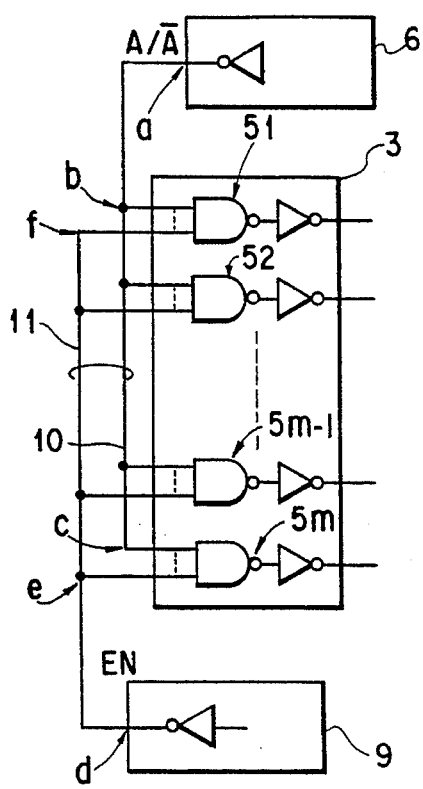
FIG. 1 shows an example of a circuit of a semiconductor apparatus constituting a conventional semiconductor memory.
Figure 2:
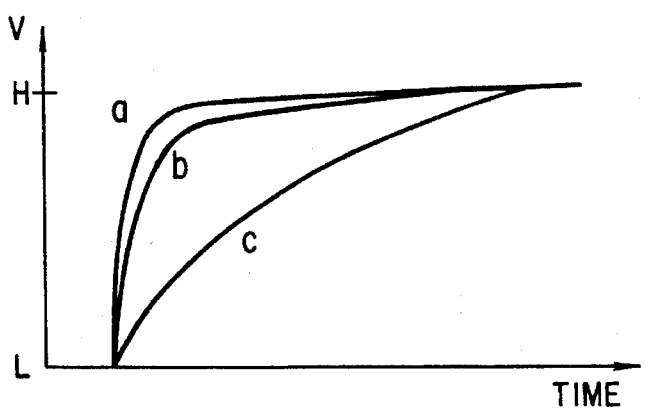
FIG. 2 is a characteristic graph showing the state of delay of an input signal at points a, b and c in FIG. 1.
Figure 3:
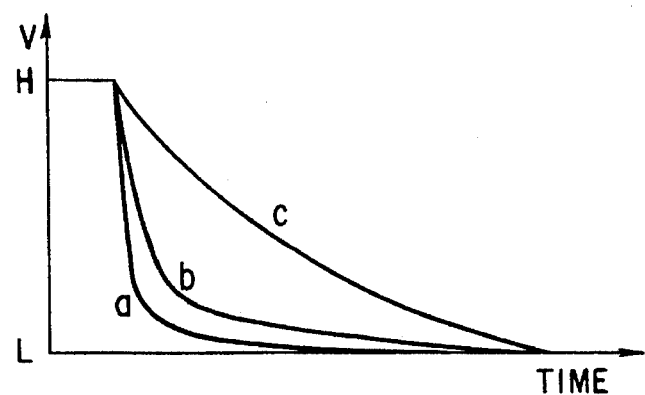
FIG. 3 is a characteristic graph showing the state of delay of an input signal at points a, b and c in FIG. 1.
Figure 4:
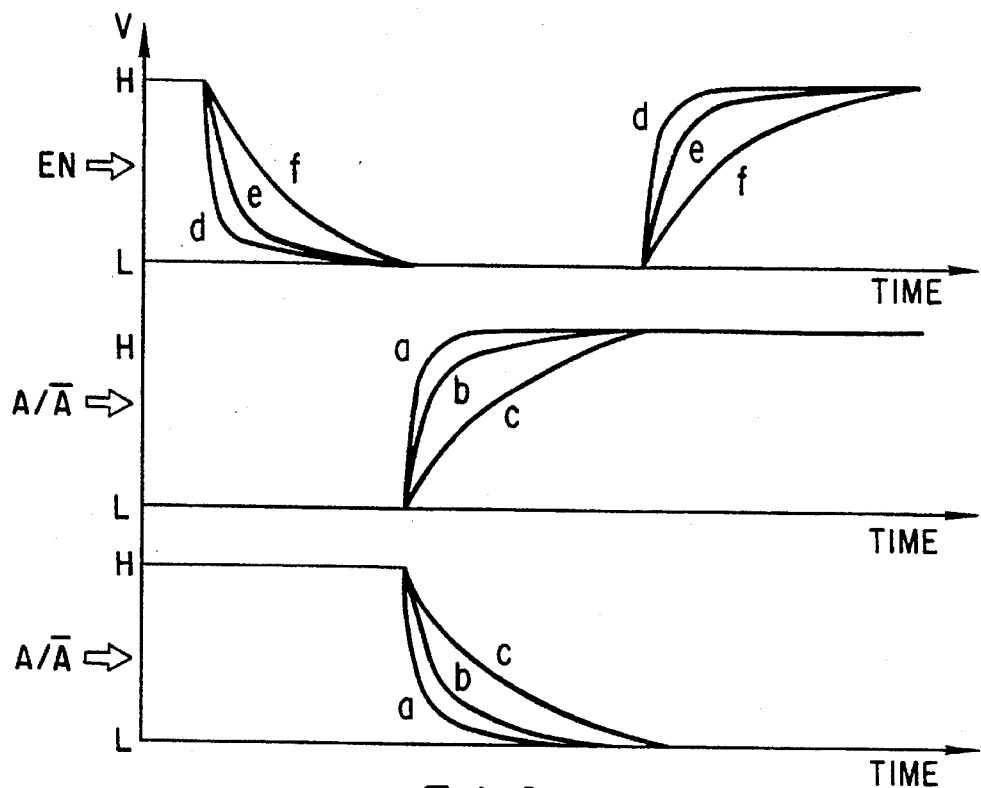
FIG. 4 is a view for explaining how the activation of a row decoder 3 as shown in FIG. 1 is subjected to temporal influence by a wiring delay.

As regards the first wiring 30, a distance l1 between points b and c is substantially equal to a distance l2 between points b and d. In the prior art as shown in FIG. 1, the difference between the distance from the output terminal of the address buffer 6 to the input terminal of the logic circuit 51 closest to the address buffer 6 and the distance from the output terminal of the address buffer 6 to the logic circuit 5n farthest from the address buffer 6 is about l1+l2. By contrast, in the embodiment as shown in FIG. 6, the difference can substantially be halved to (l1+l2)/2.

The wiring between the circuit portion of the address buffer 6 and the output terminal point a or between the circuit portions of the logic circuits and, e.g. points b, c and d of the first wiring 30 is formed of a refractory metal such as tungsten or a metal such as aluminum. Alternatively, such wiring may be made of polysilicon or silicide.

The wiring between the circuit portions of the logic circuits and, e.g. points b, c and d of the first wiring 30, the first wiring 30 and the second wiring 40 may be respectively formed of multiple A1 wiring layers.

Figure 8:
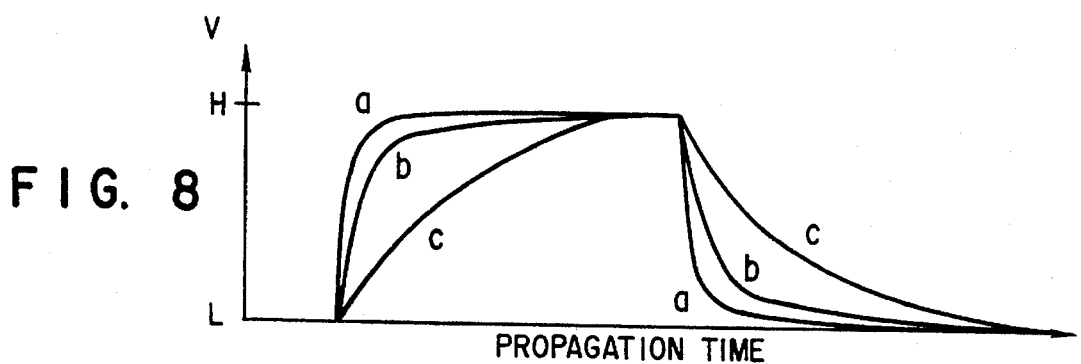
FIG. 8 is a view for explaining a wiring delay at points a, b and c in the circuit of the conventional semiconductor apparatus as shown in FIG. 1.
Figure 9:
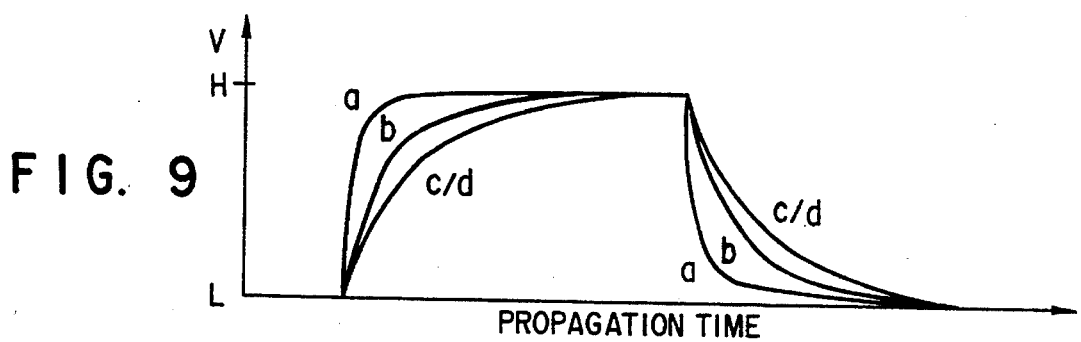
FIG. 9 is a view for explaining a wiring delay at points a, b and c in the circuit of the semiconductor apparatus of the present invention as shown in FIG. 6.

In this wiring structure, the address signal A/$\overline{A}$ is output from the output terminal point a of the address buffer 6. The address signal A/$\overline{A}$ is input to the input terminals of the logic circuits 51, . . . , 5n via the connection node (point b) between the first wiring 30 and second wiring 40. The propagation characteristics of the signal at this time will now be explained. FIG. 8 is a propagation characteristic diagram of the signal in the conventional wiring structure as shown in FIG. 1, and FIG. 9 is a propagation characteristic diagram of the wiring structure of the present embodiment as shown in FIG. 6. In each of FIGS. 8 and 9, the ordinate indicates a signal potential (V) at H or L level, and the abscissa indicates a propagation time. As compared to the conventional signal propagation waveform, in the propagation waveform according to this embodiment, the signal propagation is slower at the nearest input point b whereas it is faster at the farthest input point c or d. Thus, the difference in propagation time of the same signal between the nearest and farthest input points is decreased. In other words, the influence due to wiring delay decreases and the high-speed operation of the semiconductor apparatus can be achieved. In the semiconductor apparatus as shown in FIG. 6, a resistance component R and a capacitance component C are similarly present in the first wiring 30, which is the input wiring of the row decoder 3, and the second wiring 40, which is the output wiring of the address buffer 6. In addition, an input capacitance Cin connected to the input terminals of the logic circuits is additionally present in the first wiring 30. Accordingly, the propagation delay per unit length of the first wiring 30 is R*(C+Cin), which is obviously greater than the propagation delay R*C per unit length of the second wiring 40.

In the prior art as shown in FIG. 8, the difference in wiring delay between points b and c is considerably great. By contrast, according to the present embodiment, the second wiring 40 with a low degree of wiring delay is extended and the first wiring 30 with a high degree of wiring delay is shortened, thereby decreasing the difference in wiring delay between points b and c and increasing a signal propagation speed in general.

A second embodiment of the present invention will now be described with reference to FIG. 10.

Figure 10:
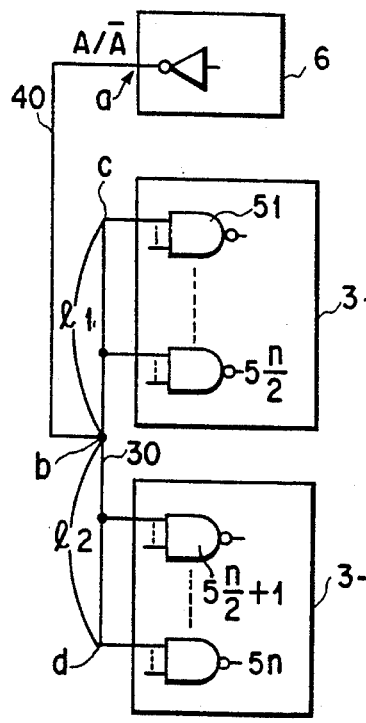
FIG. 10 shows a structure of a main circuit portion of a semiconductor apparatus according to a second embodiment of the invention.

Like FIG. 6, FIG. 10 shows schematically a circuit configuration of a wiring structure of an address buffer 6 and a row decoder 3 of the semiconductor memory apparatus as shown in FIG. 5. In FIG. 10, wiring of signal lines between the decoder control circuit and row decoder is omitted.

The row decoder 3 comprises logic circuits 51 to 5n. The row decoder 3 as shown in FIG. 10 is constituted by dividing the row decoder shown in FIG. 6 into a first row decoder 3-1 and a second row decoder 3-2. The first row decoder 3-1 comprises a first logic circuit to an n/2-th logic circuit, and the second row decoder 3-2 comprises an n/2+1-th logic circuit to an n-th logic circuit. The first wiring 30 is connected to the input terminals of the logic circuits 51 to 5n and is provided in parallel to the direction of arrangement of the logic circuits 51 to 5n. The second wiring 40 is provided between the output terminal point a of the address buffer 6 and a predetermined point b in the first wiring 30. Like the embodiment as shown in FIG. 6, the second wiring 40 has a portion extending in parallel to the first wiring 30. In the area of this parallel portion, the wirings 30 and 40 are provided substantially in parallel to each other. In order to decrease the difference in wiring distance, it is desirable to set the predetermined point b of the first wiring 30 connected to the second wiring 40 at a middle point of the first wiring 30. The middle point lies between the n/2-th logic circuit 5(n/2) and the (n/2)+1-th logic circuit 5(n/2)+1. Accordingly, if the input terminal of the first logic circuit 51 is set at point c and the input terminal of the n-th logic circuit 5n is set at point d, the distance $l_1$ between points b and c of the first wiring 30 is substantially equal to the distance $l_2$ between points b and d. Thereby, the difference in wiring distance, which is conventionally about $l_1+l_2$, can be substantially halved to $(l_1+l_2)/2$ in the present embodiment.

A third embodiment of the present invention will now be described with reference to FIG. 11.

Figure 11:
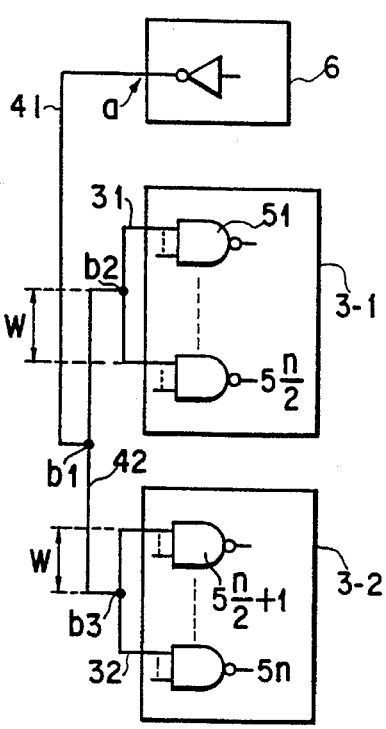
FIG. 11 shows a structure of a main circuit portion of a semiconductor apparatus according to a third embodiment of the invention.

Like FIG. 6, FIG. 11 shows schematically a circuit configuration of a wiring structure of an address buffer 6 and a row decoder 3 of the semiconductor memory apparatus as shown in FIG. 5. In FIG. 11, wiring of signal lines between the decoder control circuit and row decoder is omitted. The row decoder 3 in which logic circuits 51 to 5n are repeatedly arranged and the address buffer 6 are arranged, as shown in FIG. 7, like the first embodiment. As in the first embodiment, signals are transmitted from the address buffer 6 to the row decoder 3 via the first wiring 30 and second wiring 40. The row decoder 3 comprises logic circuits 51 to 5n. The row decoder 3 employed in this embodiment is constituted by dividing the row decoder of the first embodiment into a first row decoder 3-1 and a second row decoder 3-2. The first row decoder 3-1 comprises a first logic circuit to an n/2-th logic circuit, and the second row decoder 3-2 comprises an (n/2)+1-th logic circuit to an n-th logic circuit. The first wiring comprises two wirings 31 and 32. The second wiring comprises two wirings 41 and 42. The wiring 31 is connected to the input terminals of the logic circuits 51 to 5(n/2) of the first row decoder 3-1 and is arranged in the direction of arrangement of the logic circuits.

Figure 12:
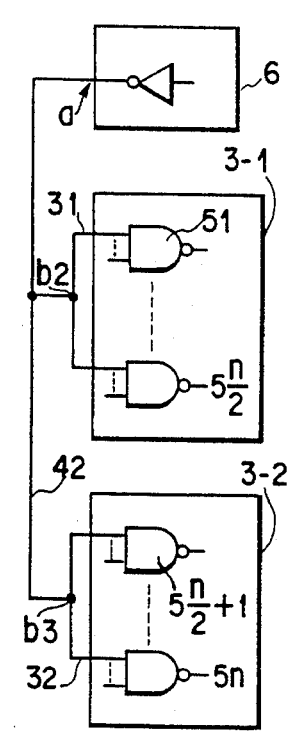
FIG. 12 shows a structure of a main circuit portion of a semiconductor apparatus according to a fourth embodiment of the invention.

The wiring 32 is connected to the input terminals of the logic circuits 5((n/2)+1) to 5n of the second row decoder 3-2 and is provided in the direction of the arrangement of the logic circuits. Wiring 41 is connected between the output terminal point a of the address buffer 6 and a predetermined point b1 of the wiring 42. The wiring 42 is provided between the predetermined point b1 and predetermined points b2 and b3 of the wirings 31 and 32. It is desirable that the predetermined points b1, b2 and b3 be set at substantially middle points of the wiring 31, wiring 32 and second wiring 42, respectively. The wiring 42 has portions extending in parallel to the wirings 31 and 32. In the area of these portions, the wirings 31, 32 and 42 are substantially in parallel to one another. In this embodiment, the difference in distance of passage of the same signal is more reduced than in the first embodiment. In other words, the influence due to the wiring delay is decreased and the high-speed operation of the semiconductor apparatus can be achieved. However, in the wiring structure of this embodiment, since the length of the second wiring is increased and the wiring area is enlarged, an increase in integration density of the semiconductor apparatus cannot fully be achieved. Thus, it is preferable to adopt a multi-layer (two-layer, three-layer, etc.) wiring structure. FIG. 12 shows an example in which the second wiring 42 is connected to two first wirings 31 and 32. The wiring area can be made less than that in the embodiment of FIG. 11, although the difference in distance of passage of the same signal is greater.

In the above embodiments, the row decoder 3 is employed as a first circuit. However, in the present invention, the first circuit is limited to the row decoder 3, but it may be a column decoder. In this case, a control signal buffer may be used as a second circuit for outputting an input signal input to the column decoder. The semiconductor apparatus is not limited to the semiconductor memory apparatus but it may be a logical integrated circuit.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A semiconductor apparatus comprising:

a semiconductor substrate;

a first circuit arranged on a major surface of said semiconductor substrate and including a plurality of logic circuits of an identical structure, said logic circuits having input terminals supplied with identical signals;

first metal wiring arranged on said semiconductor substrate in a direction substantially identical to a direction of arrangement of said logic circuits, said first metal wiring connected to one of the input terminals of each of the logic circuits;

a second circuit arranged on the major surface of said semiconductor substrate in an outside area which does not overlap an area extending in a direction substantially perpendicular to the direction of arrangement of the logic circuits, said second circuit having an output terminal supplying an identical signal to said one of the input terminals of each of the logic circuits of said first circuit; and second metal wiring connected between said output terminal of said second circuit and said first metal wiring and having a portion extending substantially parallel to and partially overlapping with said first metal wiring.

2. The semiconductor apparatus of claim 1, wherein said second metal wiring is connected at one end to a substantially middle point of said first metal wiring.

3. A semiconductor apparatus comprising:

a semiconductor substrate;

a first circuit arranged on a major surface of said semiconductor substrate and including a plurality of logic circuits of an identical structure, said logic circuits having input terminals supplied with identical signals;

first metal wiring arranged on said semiconductor substrate in a direction substantially identical to a direction of arrangement of said logic circuits, said first metal wiring connected to one of the input terminals of each of the logic circuits;

a second circuit arranged on the major surface of said semiconductor substrate in an outside area which does not overlap an area extending in a direction substantially perpendicular to the direction of arrangement of the logic circuits, said second circuit having an output terminal supplying an identical signal to said one of the input terminals of each of the logic circuits of said first circuit; and second metal wiring connected between said output terminal of said second circuit and said first metal wiring and having a portion extending substantially parallel to and partially overlapping with the first metal wiring, wherein said first metal wiring includes a plurality of wirings each corresponding to a predetermined number of said logic circuits of said first circuit and each connected to one of the input terminals of each of said logic circuits of said predetermined number of said logic circuits, and wherein said second metal wiring is connected to a predetermined point of each of the plurality of wirings of said first metal wiring.

4. The semiconductor apparatus of claim 3, wherein said second metal wiring is connected to a substantially middle point of each of the plurality of wirings of said first metal wiring.

5. The semiconductor apparatus of claim 1, wherein said first circuit includes n of said logic circuits and said second metal wiring is connected at one end to a point between an (n/2)th logic circuit and an (n/2)+1-th logic circuit.

6. A semiconductor apparatus comprising:

a semiconductor substrate;

a first circuit arranged on a major surface of said semiconductor substrate and including a plurality of logic circuits of an identical structure, said logic circuits having input terminals supplied with identical signals;

first metal wiring arranged on said semiconductor substrate in a direction substantially identical to a direction of arrangement of said logic circuits, said first metal wiring connected to one of the input terminals of each of the logic circuits and having a first signal propagation delay per unit length;

a second circuit arranged on the major surface of said semiconductor substrate in an outside area which does not overlap an area extending in a direction substantially perpendicular to the direction of arrangement of the logic circuits, said second circuit having an output terminal supplying an identical signal to said one of the input terminals of each of the logic circuits of said first circuit including a logic circuit closest to said output terminal and a logic circuit farthest from said output terminal; and second metal wiring connected between said output terminal of said second circuit and said first metal wiring and having a portion extending substantially parallel to and partially overlapping with said first metal wiring and having a second signal propagation delay per unit length less than said first signal propagation delay per unit length, so that a difference in signal propagation delay between said closest logic circuit and said farthest logic circuit decreases and a signal propagation speed in general increases relative to a situation where said second metal wiring does not have said portion extending substantially parallel to and partially overlapping with said first metal wiring.

7. The semiconductor apparatus of claim 6, wherein said second metal wiring is connected at one end to a substantially middle point of said first metal wiring.

8. The semiconductor apparatus of claim 6, wherein said first circuit includes n of said logic circuits and said second metal wiring is connected at one end to a point between an (n/2)th logic circuit and an (n/2)+1-th logic circuit.

9. A semiconductor apparatus comprising:

a semiconductor substrate;

a first circuit arranged on a major surface of said semiconductor substrate and including a plurality of logic circuits of an identical structure, said logic circuits having input terminals supplied with identical signals;

first metal wiring arranged on said semiconductor substrate in a direction substantially identical to a direction of arrangement of said logic circuits, said first metal wiring connected to one of the input terminals of each of the logic circuits and having a first signal propagation delay per unit length;

a second circuit arranged on the major surface of said semiconductor substrate in an outside area which does not overlap an area extending in a direction substantially perpendicular to the direction of arrangement of the logic circuits, said second circuit having an output terminal supplying an identical signal to said one of the input terminals of each of the logic circuits of said first circuit including a logic circuit closest to said output terminal and a logic circuit farthest from said output terminal; and second metal wiring connected between said output terminal of said second circuit and said first metal wiring and having a portion extending substantially parallel to and partially overlapping with the first metal wiring and having a second signal propagation delay per unit length less than said first signal propagation delay per unit length, wherein said first metal wiring includes a plurality of wirings each corresponding to a predetermined number of said logic circuits of said first circuit and each connected to one of the input terminals of each of said logic circuits of said predetermined number of said logic circuits, and wherein said second metal wiring is connected to a predetermined point of each of the plurality of wirings of said first metal wiring, so that a difference in signal propagation delay between said closest logic circuit and said farthest logic circuit decreases and a signal propagation speed in general increases relative to a situation where said second metal wiring does not have said portion extending substantially parallel to and partially overlapping with said first metal wiring.

10. The semiconductor apparatus of claim 9, wherein said second metal wiring is connected to a substantially middle point of each of the plurality of wirings of said first metal wiring.

11. A semiconductor apparatus comprising:

a semiconductor substrate;

a first circuit arranged on a major surface of said semiconductor substrate and including a plurality of groups of logic circuits of an identical structure, said groups of logic circuits including a predetermined number of said logic circuits each having input terminals supplied with identical signals;

first metal wiring arranged on said semiconductor substrate in a direction substantially identical to a direction of arrangement of said groups of logic circuits, said first metal wiring connected to one of the input terminals of each of the logic circuits and having a first signal propagation delay per unit length;

a second circuit arranged on the major surface of said semiconductor substrate in an outside area which does not overlap an area extending in a direction substantially perpendicular to the direction of arrangement of the groups of logic circuits, said second circuit having an output terminal supplying an identical signal to said one of the input terminals of each of the logic circuits of said first circuit including a logic circuit closest to said output terminal and a logic circuit farthest from said output terminal; and second metal wiring connected between said output terminal of said second circuit and said first metal wiring and having a portion extending substantially parallel to and partially overlapping with the first metal wiring and having a second signal propagation delay per unit length less than said first signal propagation delay per unit length, so that a difference in signal propagation delay between said closest logic circuit and said farthest logic circuit decreases and a signal propagation speed in general increases relative to a situation where said second metal wiring does not have said portion extending substantially parallel to and partially overlapping with said first metal wiring.

12. The semiconductor apparatus of claim 11, wherein said second metal wiring is connected to a substantially middle point of said first metal wiring.

13. A semiconductor apparatus comprising:

a semiconductor substrate;

a first circuit arranged on a major surface of said semiconductor substrate and including a plurality of logic circuits of an identical structure, said logic circuits having input terminals supplied with identical signals;

first metal wiring arranged on said semiconductor substrate in a direction substantially identical to a direction of arrangement of said logic circuits, said first metal wiring connected to one of the input terminals of each of the logic circuits;

a second circuit arranged on the major surface of said semiconductor substrate in an outside area which does not overlap an area extending in a direction substantially perpendicular to the direction of arrangement of the logic circuits, said second circuit having an output terminal supplying an identical signal to said one of the input terminals of each of the logic circuits of said first circuit; and second metal wiring connected between said output terminal of said second circuit and said first metal wiring and having a portion extending substantially parallel to and partially overlapping with the first metal wiring, wherein said first metal wiring includes a plurality of wirings each corresponding to a predetermined number of said logic circuits of said first circuit and each connected to one of the input terminals of each of said logic circuits of said predetermined number of said logic circuits, wherein said second metal wiring includes a plurality of wirings, and wherein said second metal wiring is connected to a predetermined point of each of the plurality of wirings of said first metal wiring.

14. The semiconductor apparatus of claim 13, wherein said second metal wiring is connected to a substantially middle point of each of the plurality of wirings of said first metal wiring.

15. The semiconductor apparatus of claim 13, wherein said first circuit includes n of said logic circuits and said second metal wiring is connected to a point between an (n/2)th logic circuit and an (n/2)+1-th logic circuit.

16. The semiconductor apparatus of claim 13, wherein said plurality of wirings of said second metal wiring includes an interconnecting wiring connected to said predetermined point of each of the plurality of wirings of said first metal wiring, and an output wiring connected between said output terminal and a predetermined point of said interconnecting wiring.

17. The semiconductor apparatus of claim 16, wherein said interconnecting wiring has a portion extending substantially parallel to and partially overlapping with the first metal wiring.

18. The semiconductor apparatus of claim 16, wherein said output wiring has a portion extending substantially parallel to and partially overlapping with the first metal wiring.

19. The semiconductor apparatus of claim 16, wherein said predetermined point of said interconnecting wiring is a substantially middle point of said interconnecting wiring.

20. The semiconductor apparatus of claim 17, wherein said portion of said interconnecting wiring includes a plurality of portions each extending substantially parallel to and partially overlapping with each of the plurality of wirings of the first metal wiring, respectively.

21. The semiconductor apparatus of claim 17, wherein said portion of said interconnecting wiring extends substantially parallel to and partially overlaps with a portion of said output wiring.

* * * * *